United States Patent [19]
Kociecki

[11] Patent Number: 5,940,288
[45] Date of Patent: Aug. 17, 1999

[54] CARD CAGE MOUNTED POWER SUPPLY WITH HEAT DISSIPATING ARCHITECTURE

[75] Inventor: John Kociecki, Powell, Ohio

[73] Assignee: Tracewell Power, Inc., Columbus, Ohio

[21] Appl. No.: 09/093,516

[22] Filed: Jun. 8, 1998

[51] Int. Cl.$^6$ .................................................. H02M 1/00
[52] U.S. Cl. .......................... 363/144; 363/141; 363/147; 361/688
[58] Field of Search .................................. 363/141, 147, 363/144; 361/687, 688, 695, 727; 211/41.12

[56] References Cited

U.S. PATENT DOCUMENTS 5,247,427  9/1993  Driscoll et al. ......................... 361/685

*Primary Examiner*—Shawn Riley
*Attorney, Agent, or Firm*—Mueller and Smith, L.L.P.

[57] ABSTRACT

A thin power supply is configured to be mounted vertically within a card cage for pin assembly connection with the forward face of a backplane. Through the utilization of a vertical flat metal platform in combination with a thin sheet metal folded fin array, the components of the power supply may be cooled by fan driven air of passing through the card cage itself. To achieve heat dissipation, those components of the power supply which exhibit higher heat dissipation characteristics are firmly coupled with the power supply platform such that the bulk of the heat generated by them is dissipated by the folded fin array and the card cage fan driven air passing over and through it. Other components not having high beat dissipation characteristics are circuit board mounted and cooled by the movement of fan driven card cage air flow which passes through the housing of the power supply.

32 Claims, 10 Drawing Sheets

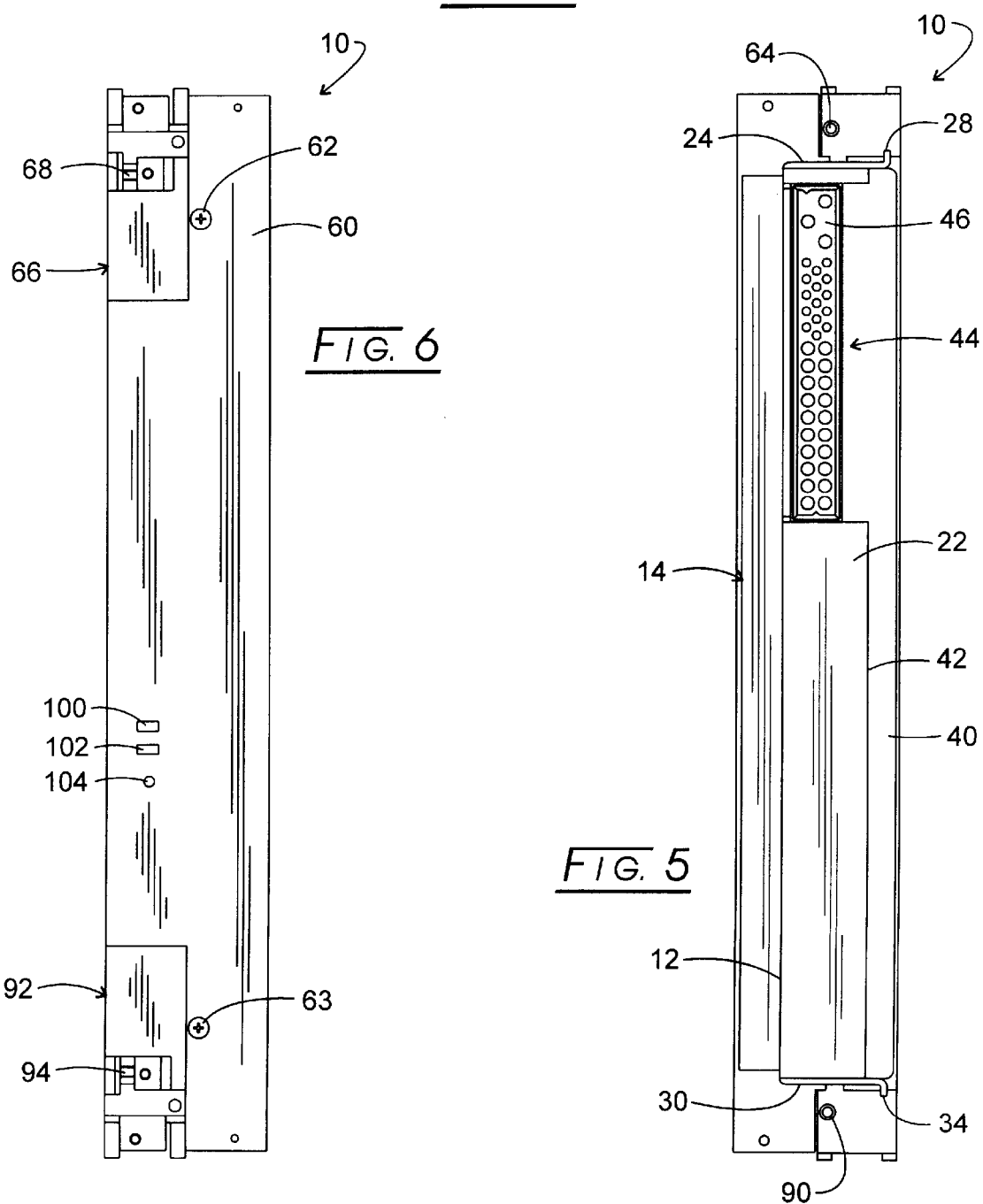

CARD CAGE MOUNTED POWER SUPPLY WITH HEAT DISSIPATING ARCHITECTURE

CROSS-REFERENCE TO RELATED APPLICATIONS

Not applicable.

STATEMENT REGARDING FEDERALLY SPONSORED RESEARCH

Not applicable.

BACKGROUND OF THE INVENTION

Early microcomputers employed buses which were direct extensions of the signal lines appearing at the pins of a microprocessor. As the technology associated with such processors rapidly progressed, users and manufacturers recognized the value of some bus standardization to facilitate system upgrading or new electronic system designs. The advantage of compatibility at the local bus level was realized early and the electronics industry has evolved and continues to evolve a number of bus standards based upon the backplane/bus specifications of more popular microprocessors and microcomputers.

Over a period of time, a number of official IEEE Bus Standards have been developed and are generally in varying stages of formal adoption. In addition, manufacturers and military and scientific users continue to define their own bus standards. Among these standards is the "VME BUS", the term "VME" representing a back-plane/bus structure referred to as "versa module Europe", developed by Motorola/Mostek/Signetics-Phillips. A "VXI Consortium" of industry and government, the term representing an acronym for "VME BUS extension for instrumentation" evolved "VXI" specifications for a VXI/VME back-plane/bus.

More recently a "COMPACT PCI" standard has been promulgated by The Industrial Computer Manufacturers Group.

In general, the back-plane/bus specifications look to the aspects of system environmental requirements such as air flow, power source derived voltage outputs, connector pin assignment, protocols and the like. Specified power supplies are required with the standards which are manifested as a sequence of voltage outputs which must remain within defined tolerances.

To complement the evolving sophistication of the backplane/bus devices and systems, improvements in supporting power supplies also have occurred. In this regard, power-switching converters are becoming an essential part of many electronic systems as industry continues its quest for miniaturization or enhanced power densities. In general, the switching converter is a power electronic system that converts one level of electrical energy to another level, at the load, by switching action. These devices continue to exhibit higher switching frequencies, newer topologies, and new integrated-circuit controllers with attendant increased conversion efficiency and power-packaging density. In the latter regard, manufacturers of these power supplies offer them as "bricks", the small devices generally being rectangularly shaped packages of typically flat configuration (i.e. one-half inch thickness), one side of which incorporates a heat transfer surface generally formed of aluminum. Because of their small size and interconnectability, the bricks are sometimes referred to as "modular power converters". These modular power converters typically are of a d.c. to d.c. variety, converting a higher level d.c. input voltage of about 180 to 400 volts to backplane/bus specified voltage values, for example for VME systems, of 5 vdc, +12 vdc, −12 vdc, and −3.3 vdc, or different combinations of such input levels. In utilizing these converter modules, power supply manufacturers combine them within a sub-housing which will include an air circulation fan or fans and supporting circuitry. The bolt-on outputs of the collection of converter modules within the sub-housing will be exposed at one of their ends for connection by cabling to corresponding power supply inputs at the backplane and elsewhere. This sub-housing containing the converter modules generally will be incorporated within a main housing having a sub rack or card cage holding the backplane and those functional circuit boards or "cards" connected to it. The main housing typically will incorporate chassis temperature controlling fans and the like. For the most part, the power supply sub-housings are mounted at the lower rear portion of an electrical system chassis or main housing. The noted cabling then connects from the power supply sub-housing to the backplane.

Forwardly of the backplane the card cage will contain a vertical slot containing assemblies which vertically support electrical circuit boards or "cards". In this regard, the circuit boards or cards are slidably supported in the slots at their tops and bottoms. Typically, each card is allocated a horizontal space which is 0.8 inches wide and the card cage height is measured in "Us", one U being 1.75 inches. The circuit boards or cards are removably attached to the backplane with plug-in connector assemblies. Circuits on the cards are cooled by being positioned within a fan driven air path, the temperature of which preferably is monitored.

The use of the noted cabling has been problematic. These cables are typically of large gauge wire, for example from 12 gauge to as low as 0 gauge, having ring tongue lugs on them which are bolted to connectors using specified torques. Such cables may vibrate with time and loosen-up such that their current handling capability often is dependent upon how reliable the torqued connection remains. The inherent induction exhibited by cables imposes electrical delay which, without correction, is manifested in current delivery difficulties where the load requires a sudden pulse of relatively large current quantity, for example as memory banks are accessed. It is desirable to be able to draw such current from a low impedance or a capacitive source. Unfortunately, cables appear as a high impedance inductive source such that there would exist an undershoot of current supplied at the commencement of such current demand and a corresponding tendency for the current to be maintained or exhibit overshoot phenomenon at the termination of a demand pulse. This undershoot and overshoot characteristic occurs generally in immunity from the lengths of cable involved. While correcting circuitry is provided to accommodate this load-related phenomenon, its addition to a system, in itself, detracts from system reliability.

Over the recent past, chassis designs themselves have been the subject of significant improvement. Their general structuring of basically a card cage, backplane, fans, and rearwardly mounted power supply sub-assembly originally was made available to users in that basic or simplistic format. Tracewell, in U.S. Pat. No. 5,168,171, issued in 1992, describes a mainframe enclosure which incorporates a microprocessor-driven support system functioning to monitor the status of power supplies, which provides an improved cooling air flow path and further provides temperature monitoring. Importantly, the status information and system controls were established at a user accessible supervisory panel mounted at the front face of the enclosure. Sold under the trade designation "Intelligent Mainframe", the improved enclosure design found ready acceptance in the electronics industry.

In an application for United States patent entitled: "Power Supply and Power Supply/Backplane Assembly and System" by Tracewell, et al., Ser. No. 08/915,861, filed Aug. 21, 1997, a power supply/backplane system is described wherein the power supply assembly is diminutive in size and exhibits a thin, flat architecture. Such architecture permits the power supply assembly to be directly mounted upon a backplane. Thus, cabling is eliminated and opportunity is provided for lessening the bulk of the chassis itself.

As electronic systems supported by mainframe enclosures continue to evolve in both sophistication and miniaturization, there is arising a concomitant call for more compact system size and, thus, more compact enclosures and system support components. These more compact systems preferably will include more efficient power delivery features exhibiting higher levels of operational reliability as well as compactness.

BRIEF SUMMARY OF THE INVENTION

The present invention is addressed to a power supply structured to be electrically coupled with a connector pin assembly which is mounted upon the forward facing surface of a backplane. Inserted along the guide slots of one or more of the card supporting positions of a card cage, the power supply is advantageously modular.

Through the utilization of a thin, vertically oriented sheet metal folded fin array in thermal exchange connection with a vertical flat metal platform the power supply requires no air cooling fan, but utilizes the fan driven air supplied to the card cage itself. This air sharing feature is achieved additionally by employing an electronic component mounting architecture based upon component thermal dissipation characteristics. In this regard, the heat transfer services of dc-to-dc power converter modules are bolted to the interior surface of the platform. A conformal, very thin conductive silicone grease carried by an aluminum foil pad is positioned between the module heat transfer surface and the platform interior surface. Thus, principal cooling or heat removal for these higher heat dissipating components is by fan driven card cage air passing through and along the U-shaped channels and troughs of the folded fin array. To improve its regulated output performance, the power supply incorporates a power factor correction network implemented with a pulse width modulated boost converter. The latter stage utilizes three higher heat dissipating components, i.e., two switching transistors and a freewheeling diode. These components are attached in thermal exchange relationship with a metal front end wall of the power supply formed integrally with the platform. Thus, these components also transfer heat via the media of the platform and its folded fin array. As a fault tolerant pairing feature of the power supply, blocking or ORing diodes are coupled with the output of the dc-to-dc power converter module. The higher heat dissipating components also are bolted to the interior surface of the platform. However, because of their smaller surface area, they are combined in this attachment with metal heat spreaders to facilitate heat dissemination to the folded fin array.

Other, relatively low heat dissipating electrical components such as capacitors, resistors and inductors are mounted upon an input circuit board attached to and spaced apart in parallel relationship with the platform. By forming arrays of air inlet and egress openings in the bottom wall and top wall of the power supply, the card cage fan driven air flow passes through the interior of the power supply in an amount sufficient to remove the lesser amount of heat dissipated by these components.

Other objects of the invention, will in part, be obvious and will, in part, appear hereinafter. The invention, accordingly, comprises the apparatus possessing the construction, combination of elements and arrangement of parts which are exemplified in the following description.

For a fuller understanding of the nature and objects of the invention, reference should be had to the following detailed description taken in connection with the accompanying drawings.

BRIEF DESCRIPTION OF THE DRAWINGS

FIG. 4 is a bottom view of the power supply of FIG. 1;

FIG. 5 is a rear view of the power supply of FIG. 1;

FIG. 6 is a front view of the power supply of FIG. 1;

DETAILED DESCRIPTION OF THE INVENTION

Figure 1:
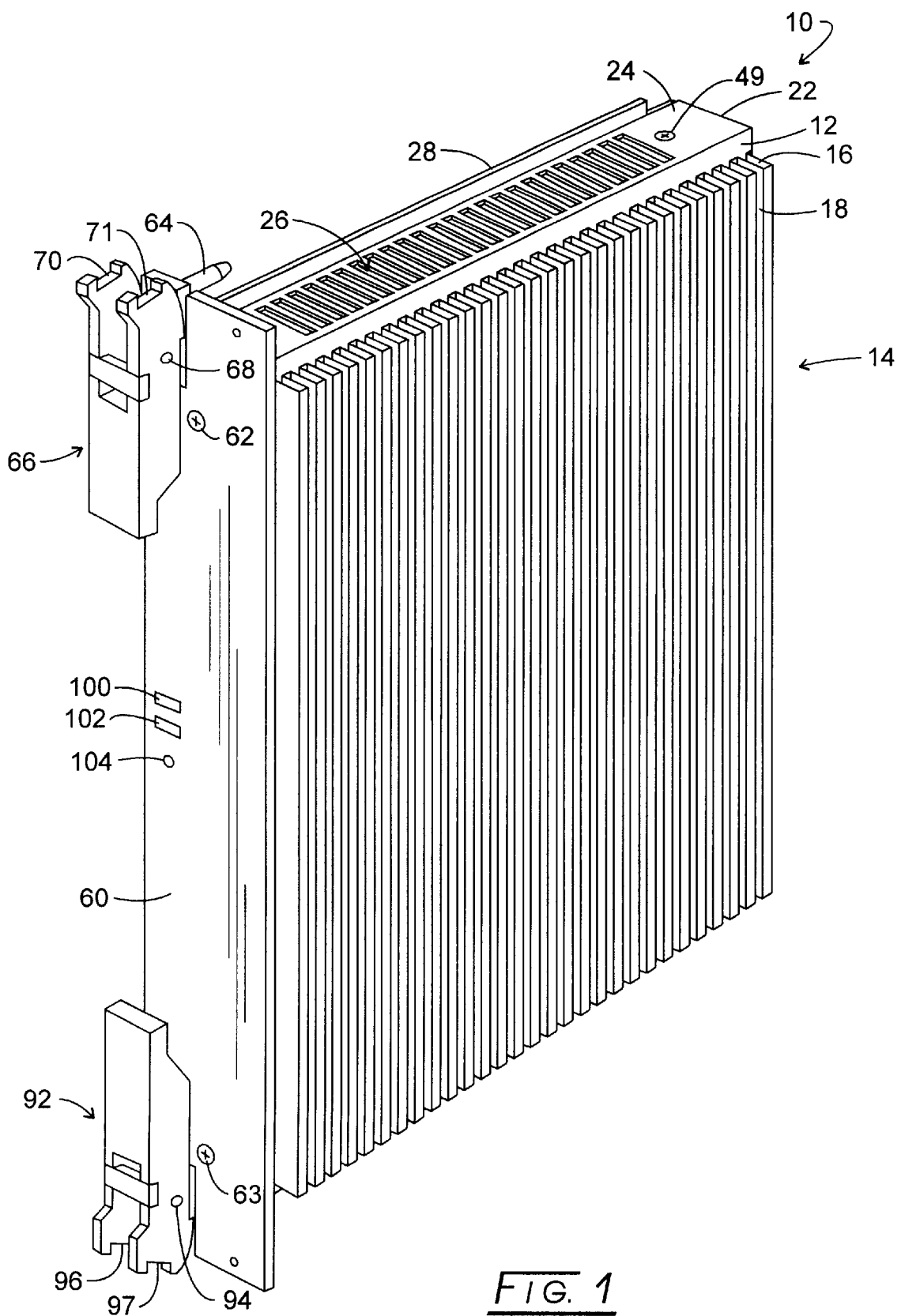
FIG. 1 is a perspective view of a power supply according to the invention.

Referring to FIG. 1, a power supply according to the invention is represented generally at 10. The housing of the power supply 10 is characterized in being formed basically as a flat aluminum sheet metal platform, an upper portion of which is seen at 12. To the exterior surface of platform 12 there is mounted a fin sheet metal folded fin heat exchanger array represented generally at 14. Array 14 is fabricated by machine bending such that it represents an alternating sequence of channels, one of which is shown at 16 which are open at the top and bottom in the vertical sense shown and troughs one of which is identified at 18 which are outwardly open. Note that the channels 16 and troughs 18 have a generally U-shaped rectangular cross sectional configuration. Array 14 is not an extrusion or the like, and is formed of thin sheet aluminum having a thickness greater than about 0.020 inch and less than about 0.10 inch. A preferred thickness is about 0.012 inch. The array 14 is mounted in thermal exchange in relationship with platform 12 and a preferred method of providing this thermal bond is through the utilization of a thermally conductive adhesive layer. That layer preferably will have a thickness of less than about 0.001 inch. An important aspect of the heat removal features of power supply 10 as it resides within a card cage is the positioning of the folded fin heat exchange array 14 on the outside of the housing, as opposed to within the housing.

Figure 2:
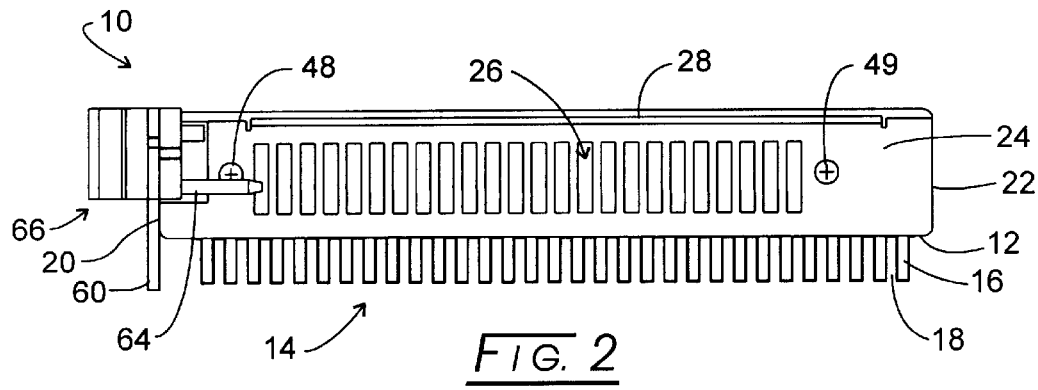
FIG. 2 is a top view of the power supply of FIG. 1.
Figure 3:
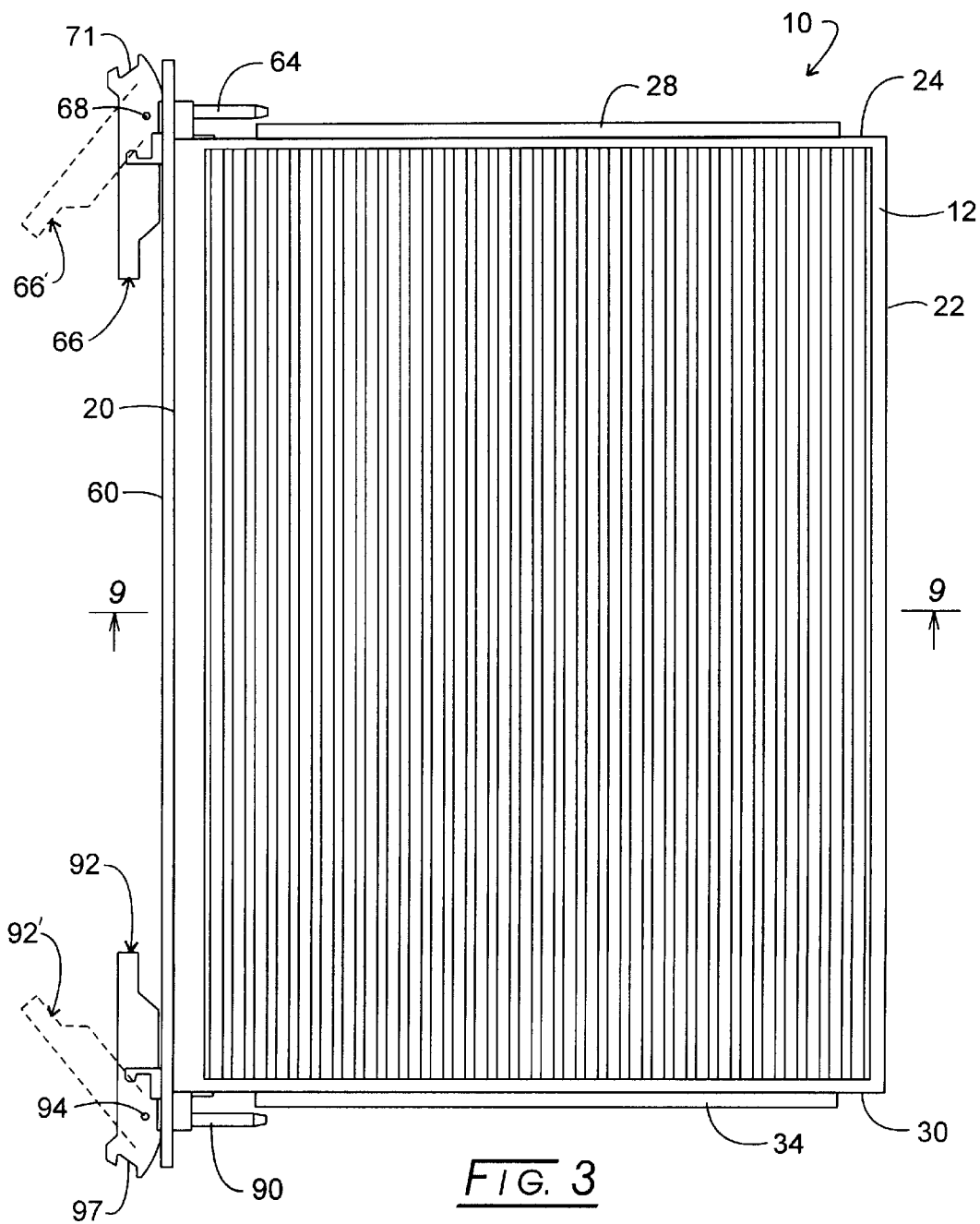
FIG. 3 is a right side view of the power supply of FIG. 1.

Looking additionally to FIGS. 2 and 3, the flat or planar sheet metal platform 12 is bent so as to integrally form a forward end wall seen in FIGS. 2 and 3 at 20. A rear end wall 22, is formed normally to the platform 12 in integral fashion. Not seen in these figures is a rectangular opening within the rear end wall 22 which carries a connector assembly. The connector assembly is positioned upwardly on the power supply 10 and incorporates a plurality of connector sockets which engage connector pins extending forwardly from a backplane with which the power supply 10 performs.

FIGS. 1–3 also reveal a top wall 24. Wall 24 is oriented normally to the plane of platform 12 and is formed integrally therewith. Note that top wall 24 includes an array of rectangular air passage openings represented generally at 26. Top wall 24 further is formed to provide an elongate thin guide 28 which extends upwardly and from the vicinity of forward end wall 20 toward rear end wall 22. Guide 28 is configured to emulate a corresponding upper edge of a circuit board or card such that it will slide within the upper slot of a card guide.

Power supply 10 similarly is configured to have a bottom wall. Looking to FIGS. 3 and 4, this bottom wall is seen at 30 and is seen to extend normally to the plane of platform 12. In this regard, the bottom wall 30 is formed integrally by bending about platform 12 and, as in the case of top wall 24, is formed having an array of rectangularity shaped air passage openings represented generally at 32 (FIG. 4). Additionally, the edge portion of bottom wall 30 is bent downwardly to form an elongate thin guide 34 which is configured and located to slide within the lower slot of a card guide.

Looking additionally to FIG. 5, the profiles of the guides 28 and 34 are revealed, showing them to be in vertical alignment. FIG. 5 also reveals that the housing includes a sheet metal cover 40 which attaches against the outer edges of top wall 24 and bottom wall 30 and against the corresponding outwardly exposed edges of forward end wall 20 and rear end wall 22. That edge with respect to rear end wall 22 is seen in FIG. 5 at 42. The figure also reveals that rear end wall 22 and the cover 40 cooperate to define an elongate rectangular opening represented generally at 44 which provides access to the earlier noted connector assembly seen at 46 which is formed of a plurality of sockets intended for engagement with corresponding pins of a connector at the backplane with which the power supply 10 performs. Cover 40 is retained in position by four machine screws extending through the top wall 24 and bottom wall 30. These machine screws engage tabs (not shown) formed integrally with the cover 40 and are seen in FIG. 2 at 48 and 49 extending through top wall 24, and at 50 and 51 in FIG. 4 extending through bottom wall 30.

Figure 13:
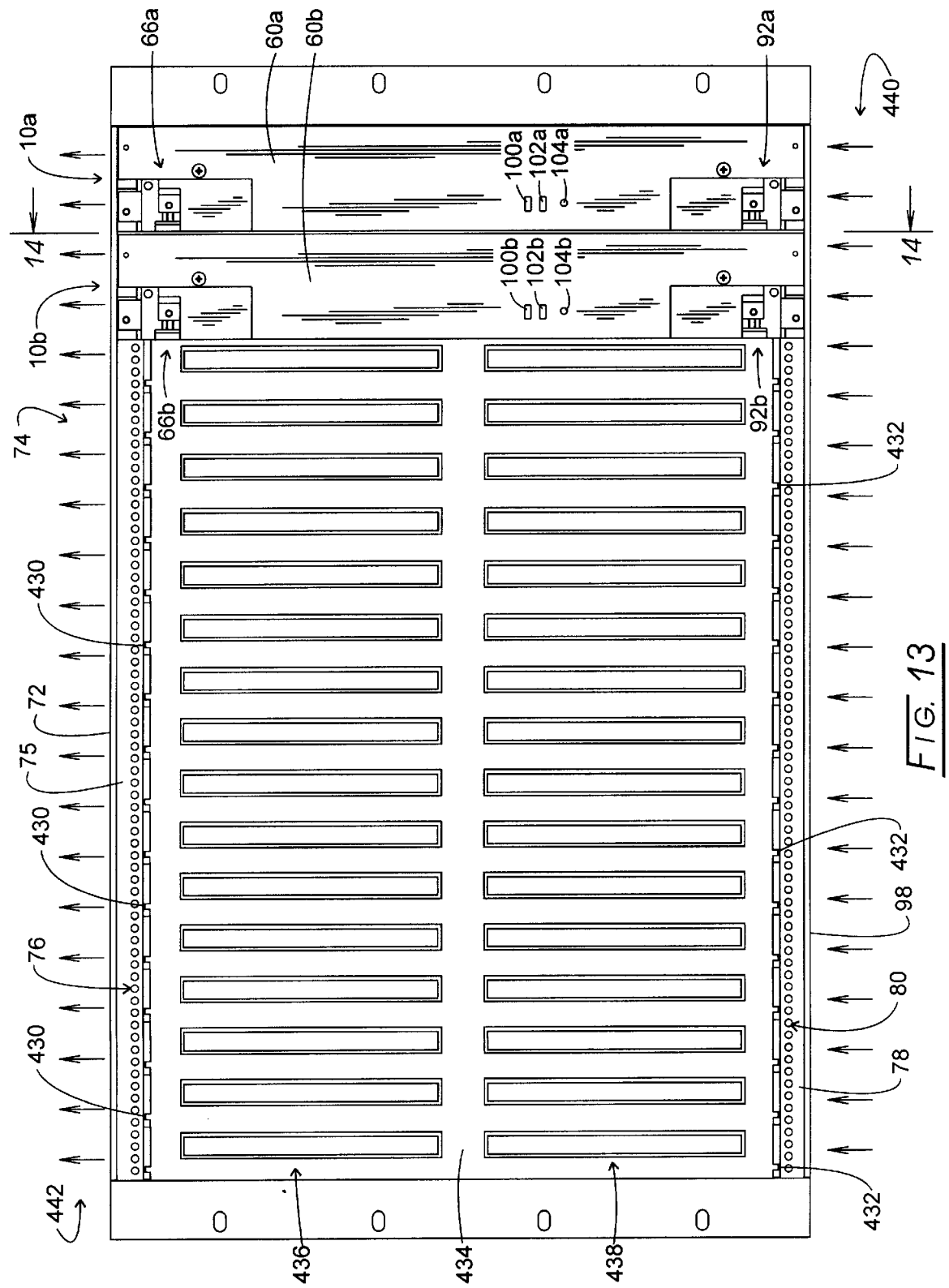
FIG. 13 is a front view of a system showing a pair of power supplies according to the invention mounted within a card cage.

Referring to FIGS. 1–4 and looking additionally to FIG. 6, an elongate rectangular front panel 60 is seen to be attached to forward wall 20 by two machine screws 62 and 63 (FIGS. 1 and 6). Front panel 60 extends above top wall 24 to support a horizontally oriented keying pin 64. Additionally mounted in this region is an ejector/injector handle -performing somewhat as an over-center latch and represented generally at 66 in its insertion orientation. handle 66 pivots about a shaft 68 in an ejection mode as seen in phantom at 66' in FIG. 3. Note that paired notches 70 and 71 are formed in the top of latch 66. These notches 70 and 71 function to engage a corresponding upper rail component of a card cage. Such a rail is seen in FIG. 13 at 72 being a component of a sub-rack or card cage represented generally at 74. Handle 66 provides over-center leverage to facilitate the insertion and removal of power supply 10 into pin-based engagement with a backplane. Note that the sub-rack 74 includes a downwardly extending component 75 having a linear array of guide holes shown generally at 76 One of these guide holes at 76 receives the keying pin as described at 64. Note additionally that the card cage 74 is formed having an upwardly extending component 78. Component 78 similarly incorporates a linear array of guide holes represented generally at 80.

Referring to FIGS. 1, 3, 4 and 6, faceplate 60 additionally is seen to extend below bottom wall 30 to support a normally horizontally disposed keying pin 90. Additionally, this region of the faceplate 60 supports a lower disposed ejector/injector handle performing somewhat as an over center latch and represented generally at 92. Identical to handle 66, the handle 92 is mounted for pivotal movement about a shaft 94 and includes paired notches 96 and 97 for engaging a card cage lower rail component. Pivotal movement of the latch 92 about shaft 94 in an ejection mode is shown in phantom at 92' in FIG. 3. Looking again momentarily to FIG. 13, the normally horizontally disposed keying pin 90 is configured for assertion within one of the holes or openings 80 of the card cage 74. Additionally, the notches 96 and 97 are configured to engage a lower rail 98. Rails 72 and 98 typically are configured as a linear sequence of openings located at the respective top and bottom surfaces of the sub-rack 74.

Returning to FIGS. 1 and 6, the front panel 60 additionally is seen to have three apertures formed therein. In this regard, rectangular openings or apertures are seen at 100 and 102. Aperture 100 extends over a green light emitting diode WED). When the a.c. input voltage to power supply 10 reaches a predetermined threshold, for example, 85 volts or greater the green LED is energized. This shows the user that the device is receiving power for carrying out regulation. Opening or aperture 102 covers a red light emitting diode (LED) which is illuminated in the presence of a fault signal which is representative of a fall-off or loss or a regulated output. Finally, a round aperture is provided at 104. Aperture 104 affords the user limited access to a momentary switch which carries out an inhibit or turning-off function. By limiting the access through the use of a small aperture as 104, inadvertent turning off of power supply 10 is avoided In order for the power supply 10 to perform advantageously within a card cage in direct connection with the forward face of a backplane, it is necessary to confine a substantial amount of power capacity within a relatively small package. This means that the power dissipating components must be mounted in a highly efficient heat transfer architecture. That is accomplished such that appropriate heat dissipation is achieved utilizing the card cooling fan driven air path of the sub-rack itself. These features are accomplished by thermally coupling the higher heat dissipating components of the power supply 10 with the noted platform 12 and its associated thin sheet metal folded fin heat exchanger array 14. Those components not exhibiting relatively higher thermal dissipation are cooled by the passage of fan driven air through the arrays of airflow openings seen in FIGS. 2 and 4 respectively at 26 and 32.

Figure 7A:
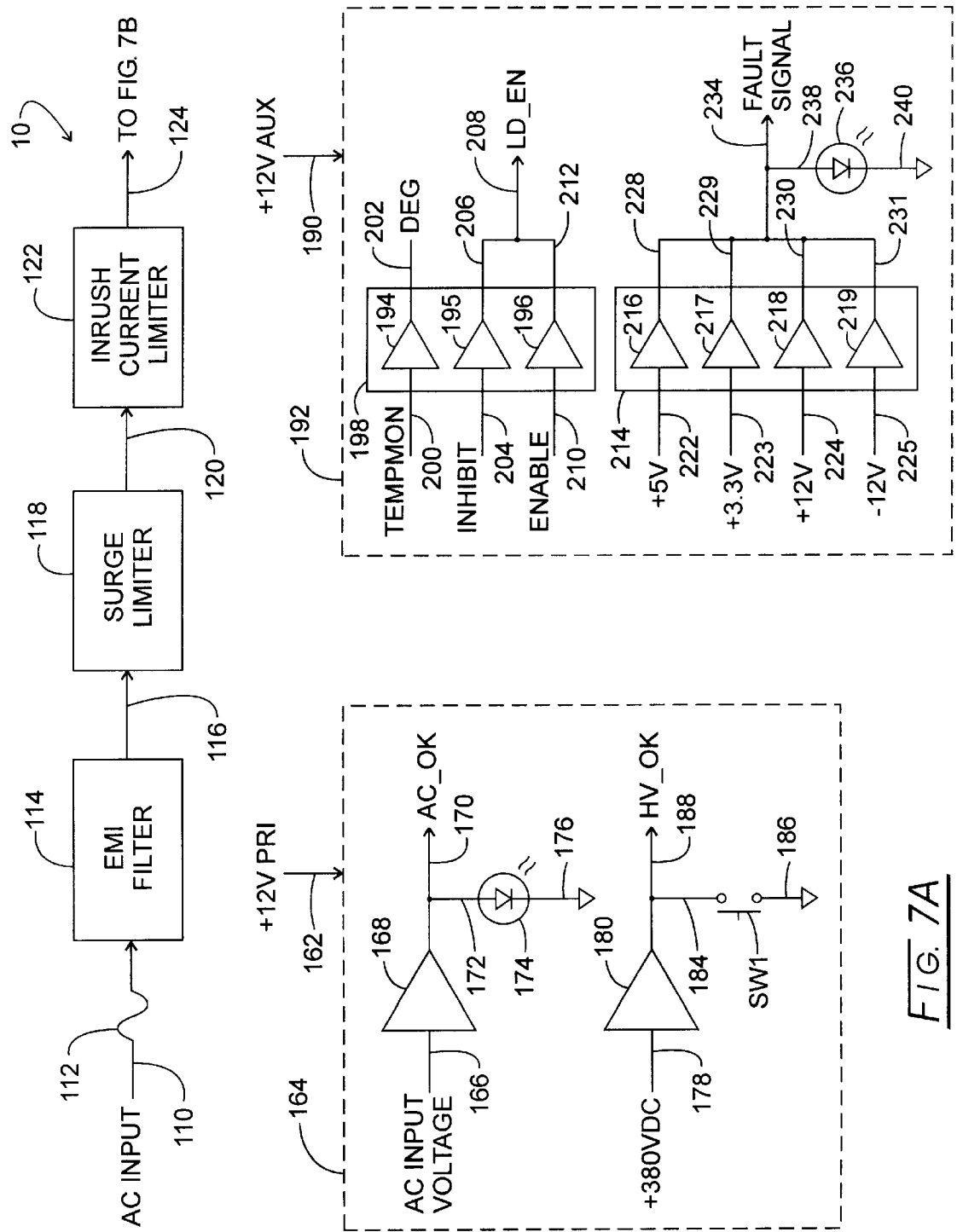
FIGS. 7A and 7B combine as labeled thereon to provide a block diagrammatic representation of the ac-to-dc components of the power supply of FIG. 1.
Figure 7B:
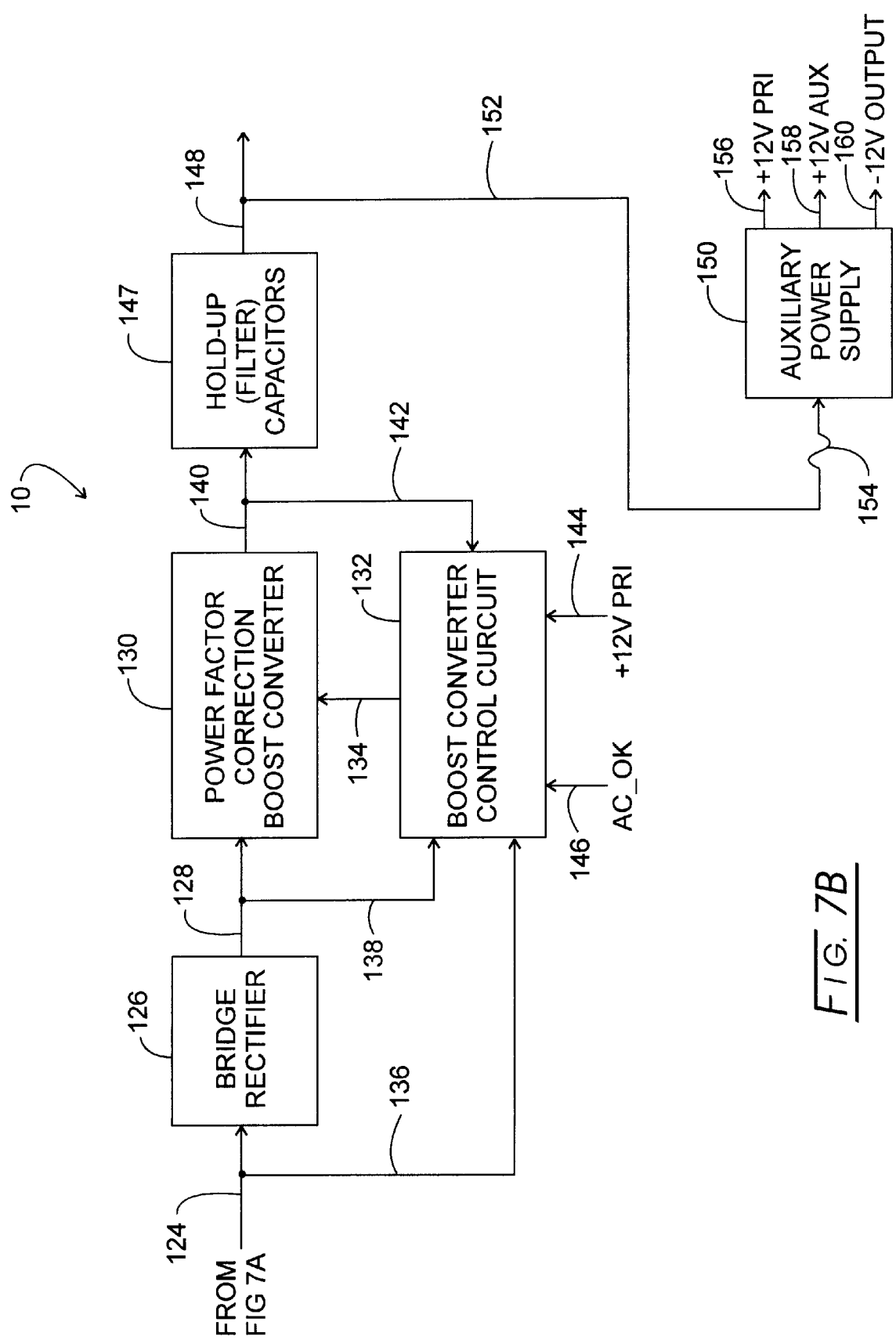

As a prelude to discussing the heat dissipating architecture of the power supply 10, the electronic components making up the system initially are described. In addition to flexible leads and the like, the components within the power supply 10 are operationally supported by two circuit boards. The components associated with one of these circuit boards, referred to as the "a.c. to d.c." circuit board are represented in FIGS. 7A and 7B. Those figures should be considered in juxtaposition in the manner labeled thereon. An alternating current input is applied to connector assembly 46 (FIG. 5) from the associated backplane. This input is represented in FIG. 7A at arrow 110. Arrow 110 incorporates a fuse 112 and extends to the input of an electromagnetic interference (EMI) filter represented at block 114. Such EMI filters typically will incorporate two inductors and capacitors which are not high heat dissipating components. The a.c. input path then continues as represented at arrow 116 and block 118 where a surge limiter function is provided. The function at block 118 may be implemented, for example, by a negative coefficient varistor. Such components also are not large heat dissipaters. The input path then continues as represented at arrow 120 and block 122 to an inrush current limiter. This function at block 122 serves to limit peak current, particularly as may be encountered at start-up where large capacitors later in the input path are undercharged. The function at block 122 may be implemented with a negative temperature coefficient thermister. In this regard, as the device heats up, its resistance value lowers or drops. Such devices also are not large heat dissipaters. The path then continues represented at arrow 124 which leads as seen in FIG. 7B to a bridge rectifier stage represented at block 126. Stage 126 is configured for example with four diodes and the package represented thereby is considered to be a substantial heat dissipater. The d.c. level then, as represented at arrow 128 and block 130 is treated by a boost converter which is controlled to carry out power factor correction. In general, a boost converter will be comprised of two transistors, an inductor and a freewheeling diode, all of which are relatively high heat dissipating components. To provide the noted power factor correction, as well as to control the voltage boost effected at this stage, a boost converter control circuit is provided, as represented at block 132. Control input to the boost converter stage 130 is represented at arrow 134. Control circuit 132 may be provided for example as an LT1249CFH, marketed by Linear Technologies, Inc. of Milpitas, Calif. The control circuit 132 carries out a somewhat complex pulse width modulated form of control in response to a sensing of the a.c. signal line 124 as represented at arrow 136; a signal representing the current at arrow 128 as directed there from via arrow 138; and a high voltage feedback from d.c. output arrow 140 as represented at arrow 142. The control circuit at block 132 also performs with a +12 VPRI auxiliary supply input as represented at arrow 144 and an AC_OK initiation signal as represented at arrow 146. In general, the AC_OK signal is derived when the a.c. input is greater than 85 volts.

The power factor corrected and boosted voltage at line 180 will have a value of, for example, 380 volts d.c. and is treated by a pair of hold-up or filter capacitors which provide a steady state d.c. output and function to correct for any minor variations in the signal on line 180. The resultant high voltage output is then presented at arrow 148 for delivery to the converter modules which are operationally associated with a printed circuit board referred to as a "d.c.-to-d.c." circuit board. In general, the hold-up capacitors are not high heat dissipaters.

To provide 12 volt power for serving the circuit components, an auxiliary power supply is employed. This auxiliary power supply is represented at block 150 and functions to tap the high voltage at arrow 148 as represented at arrow 152 containing a fuse 154. The outputs of this auxiliary power supply 150 are distributed to various points within the circuitry and are present as +12 v PRI as represented at arrow 156; +12 v AUX as represented at arrow 158; and −12 v Output as represented at arrow 160. The +12 v PRI output is utilized in conjunction with circuit components working with high voltages, while the +12 v AUX functions in conjunction with components not working with high voltages.

The +12 v PRI has been seen to be directed to the boost converter control circuit 132 as represented at arrow 144. Additionally, as represented at arrow 162 (FIG. 7A) and at dashed boundary 164 that input is utilized to power components implemented with comparators for developing the AC_OK signal discussed above, as well as a HV_OK signal. In this regard, the a.c. input voltage is directed as represented by line 166 to a comparator function represented by symbol 168. The resultant output as represented at arrow 170 occurs when the a.c. value at line 166 exceeds 85 volts. This enables the boost converter control circuit 132. Additionally, as represented by line 172, light emitting diode (LED) 174 and line 176 directed to ground, a signal line 170 also functions to illuminate green LED 174 to indicate that the input is ok. This LED is located behind earlier described aperture 100 at front panel 60. +12 v PRI also provides circuit power to another network functioning to monitor the +380 v d.c. value asserted at arrow 148. In this regard, that high voltage d.c. signal is applied, as represented at line 178 to a comparator function represented at symbol 180. The resultant signal, representing proper voltage level is represented at arrow 182 carrying a signal designated as: HV_OK. Note, additionally, that a switch, SW1 is coupled between the arrow 182 and ground as represented at lines 184 and 186. This is a momentary push switch which is located behind earlier described aperture 104 in front panel 60. Momentary pushing of the switch SW1 creates and inhibit signal which also may be derived by the system employed by the user. That system also may develop an enable signal. To turn on the converter module it is necessary to have a coincidence of the HV_OK signal and an enable or inhibit signal. In general, networks represented within dashed boundary 164 are not high heat dissipating devices.

The +12 v AUX output of the auxiliary power supply 150 is shown directed to relatively safe low voltage circuit networks as represented at arrow 190 and dashed boundary 192. Within boundary 192 there are seen three comparator functions represented by symbols 194–196 located within solid boundary 198. Comparator function 194 receives a temperature monitoring signal (TEMPMON) as represented at line 200 to provide a degrade signal (DEG) as represented at 202. The degrade signal is generated by a converter module and is present when the modules are within about ten percent of an overtemperature special condition or whenever any of the output or input voltages deteriorates or disappears.

A system generated inhibit signal (INHIBIT) is shown introduced to comparator function 195 as represented at line 204. The inhibit output then is provided at line 206 which extends to load enable (LD_EN) arrow 208. Similarly, a system generated enable (ENABLE) signal is represented as being provided at line 210 to comparator function 196 to provide an enable output at line 212 extending to arrow 208. The signal at arrow 208 functions to turn the power supply from line 148 on or off to the power converters.

Also located within dashed boundary 192 is a monitoring function shown within solid boundary 214 carrying comparator type circuit components functioning to monitor the regulated output of the power converters. These comparator network functions are represented at symbols 216–219 and corresponding input or monitoring lines 222–225. The regulated +5 v, +3.3 v, +12 v, and −12 v values are asserted at respective comparator functions 216–219 to provide outputs at respective lines 228–231. Upon the occurrence of a fault with respect to any one of these four outputs, then their commonly ORed outputs at arrow 234 will produce a fault signal (FAULT). The presence of a fault signal at arrow 234 also functions to illuminate a red light emitting diode (LED) 236 as represented by lines 238 and 240. In this regard, a logic high signal at arrow 234 will turn on LED 236, the base of which is coupled to ground via line 240.

Figure 8:
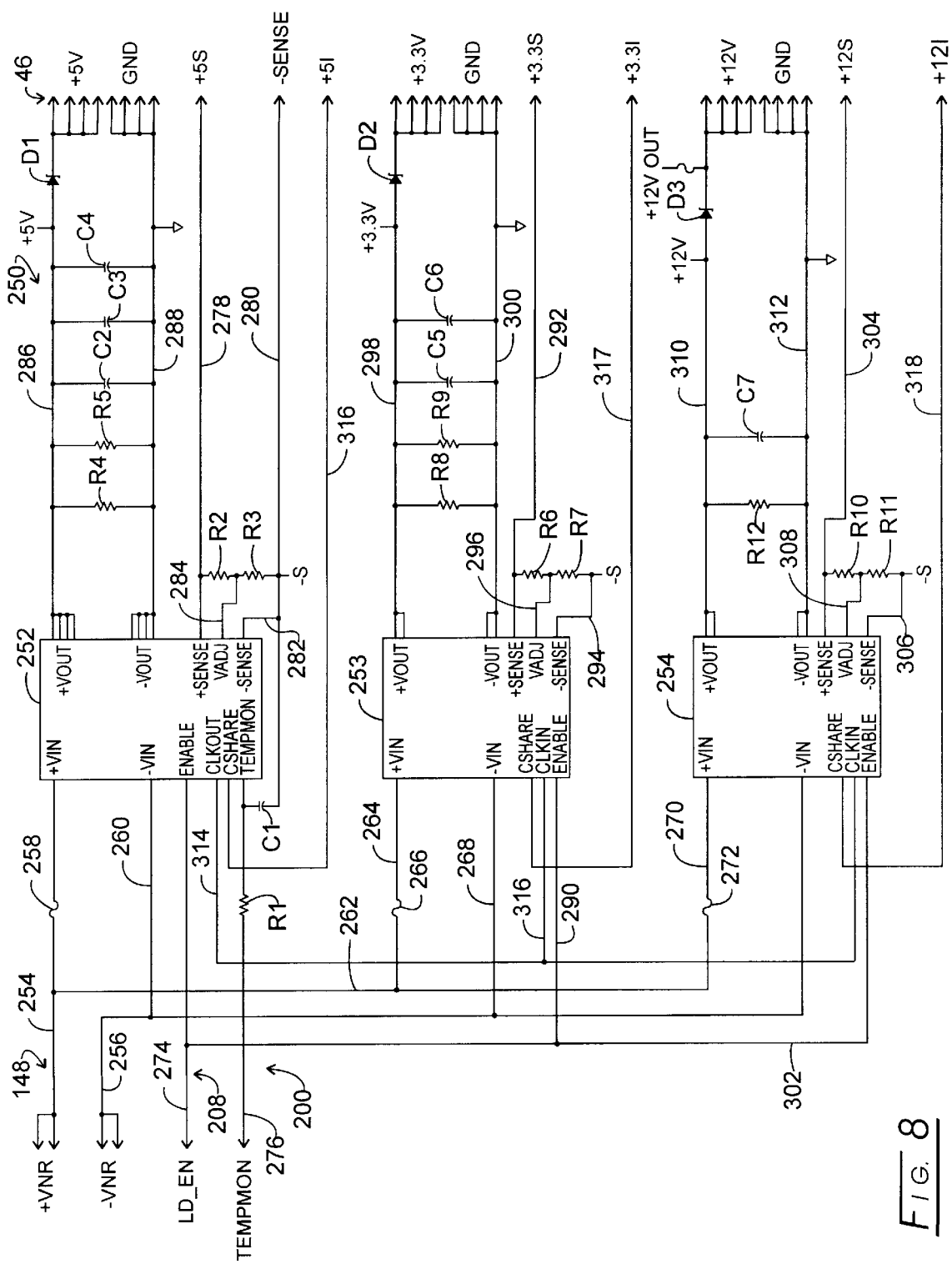
FIG. 8 is an electrical schematic diagram of the dc-to-dc components of the power supply of FIG. 1.

Referring to FIG. 8, the components and circuitry associated with the earlier noted "dc-to-dc" circuit board are revealed and represented in general at 250. The circuit 250 comprises principally three dc-to-dc converters 252–254. Power converter 252 may be provided, for example, as a type AM80A marketed by Astec (BSR) Plc, Hong Kong. Correspondingly, dc-to-dc converters 253 and 254 may be provided as type AL60A marketed by Astec (supra). High voltage dc power is made available to the converters 252–254, for example, the 380 v dc output as described in conjunction with arrow 148 in FIG. 7B. That arrow re-appears to generally identify plus and minus high voltage input lines now represented respectively at lines 254 and 256. Line 254 contains a fuse 258 and extends to the +VIN terminal of converter 252. Correspondingly, line 256 is coupled to line 260 which extends to the −VIN terminal of device 252. High voltage dc power is delivered to power converter 253 via lines 254, 262 and 264, the latter line carrying a fuse 266 and extending to the +VIN terminal. Correspondingly, lines 256 and 268 extend to the −VIN terminal of device 253. The +VIN terminal of converter 254 is coupled to line 254 via line 270, the latter line incorporating a fuse 272. The −VIN terminal of device 254 is fed from line 256. Converters 252–254 are enabled or turned on by the load enable (LD_DEN) signal described at arrow 208 in FIG. 7A. That numerical identification is present in the instant figure in general and looks to the signal line carrying the load enable signal at line 274. The TEMPMON signal introduced at line 200 in FIG. 7A is derived at the TEMPMON terminal of converter 252, as well as from a remote voltage sensing function. In this regard, the signal is presented at line 276 incorporating resistor RI and extending to the noted terminal. Additionally, the +SENSE and −SENSE terminals of converter 252 are coupled to respective lines 278 and 280. The latter line is connected through capacitor Cl to line 276 and through line 282 to the −SENSE terminal of device 282. Lines 278 and 280 extend to voltage monitoring positions at the associated backplane. The return as identified as −S also is supplied to the −SENSE terminals of devices 253 and 254. With the arrangement shown, a voltage level defect will function to generate a TEMPMON signal. That signal also will be derived upon the occurrence of a rise in temperature to a threshold within 10% of shutdown. Lines 278 and 280 also function to provide a voltage adjustment input to converter 252 as represented by divider resistor functions R2 and R3 performing in conjunction with line 284.

The regulated +5 v output from converter 252 is asserted at lines 286 and 288 and is seen to be filtered by a network including capacitors C2–C4 and resistors R4 and R5. Note that line 286 extends through a blocking or ORing diode D1. The outputs at connector 46, herein represented generally with that numeration are seen to incorporate three pin and socket connections for each of the lines 286 and 288. This is to accommodate for high current levels which may occur.

A load enable (LD_EN) input to converter 253 is provided from lines 274 and 290. Remote voltage sensing for the device 253 is provided at line 292 extending to the +SENSE terminal of the converter. The −SENSE terminal of device 253 is connected via line 294 to the common SENSE return, −S. A voltage adjust terminal (VADJ) receives an adjustment input via line 296 extending from a divider resistors function represented at resistor R6 and R7. The +VOUT temninal of converter 253 is provided at line 298 incorporating blocking or ORing diode D2 and extending to a multiple pin combination of the connector assembly 46. Correspondingly, the −VOUT terminal of device 253 is coupled to the connector assembly 46 via line 300. The +3.3 v output is filtered by the network combination of capacitors C5 and C6 and resistors R8 and R9.

Power converter 254 is enabled from lines 274 and 302. The +SENSE terminal of the device 254 is connectable to a remote sensing position on the backplane by line 304 extending to the connector assembly 46. As before, the −SENSE terminal is connected in common to line 280 via line 306. A resistor function represented at divider resistors R10 and R11 provides a voltage adjust input to the VADJ terminal via a line 308. The +VOUT terminal of converter 254 is coupled to four terminals of the connector assembly 46 via line 310 incorporating ORing or blocking diode D3, while the corresponding −VOUT terminal is connected to the connector assembly 46 via line 312. The +12 v output is filtered by a network including capacitor C7 and resistor R12.

Diodes D1–D3 function to block back-flow of current where power supplies 10 are connected in common. In this regard, the devices are referred to as "fault tolerant" in that they can be paired, for example, as described later herein in connection with FIG. 13. The clock out (CLKOUT) terminal of converter 252 is coupled via lines 314 and 316 to the CLKIN terminal of converter 253 and via line 314 to the CLKIN terminal of converter 254. This is a frequency coordinating feature for the operation of power converters 252–254. Larger converter 252 is the dominant one of the three. In this regard, it is associated with the major currents of the system and holds the larger potential for heat generation. For this reason, the TEMPMON signal is limited to this larger converter. The corresponding temperature monitoring terminals of devices 253 and 254 also can be monitored at the desire of the user. Where as the power supplies are paired, the user may wish to enhance the current output capacity of the system for a given regulated voltage output. This is carried out by coupling these outputs in parallel. However, to provide for such parallel coupling without permitting a dominance of one converter over another in supplying higher current demands, the converters themselves are configured with a current sharing circuit function. That function basically compares the average current provided by all converted modules for a given shared condition with individual currents. Where a difference from one module to the other is detected, correction then is made. Provision for utilizing this feature of devices 252–254 is provided by respective lines 316–318 extending from the CSHARE terminals thereof to the connector assembly 46.

Figure 9:
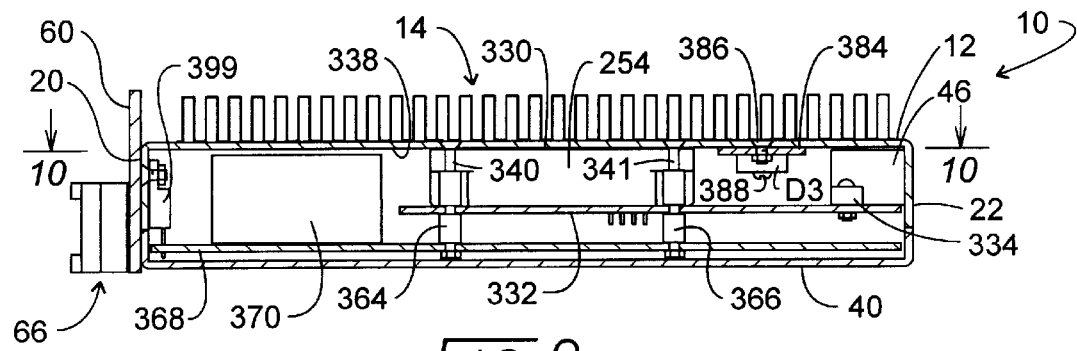
FIG. 9 is a sectional view taken through the plane 9—9 in FIG. 3.
Figure 10:
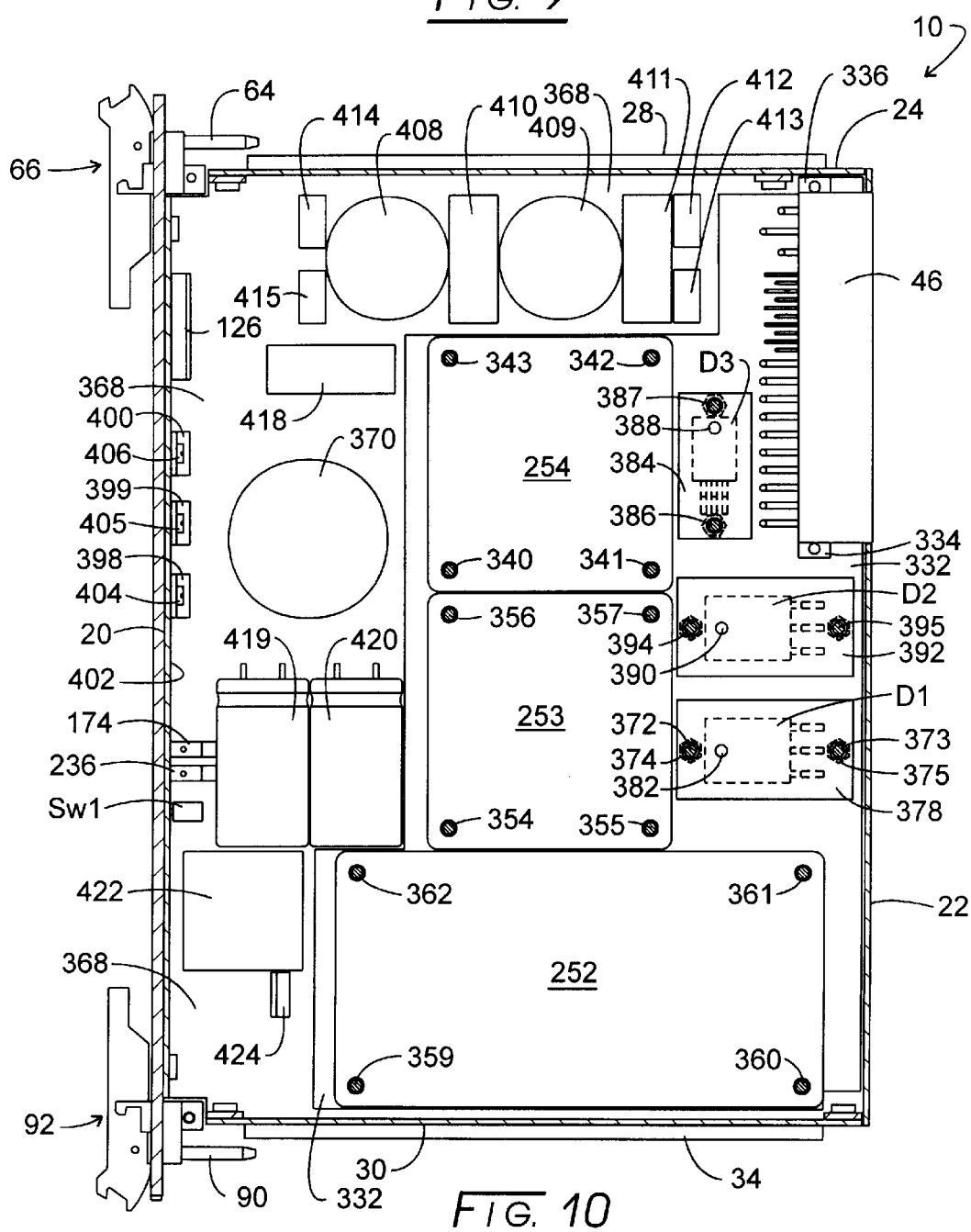
FIG. 10 is a sectional view taken through the plane 10—10 in FIG. 9.

Referring the FIGS. 9 and 10 the arrangement and mounting of components about the platform 12 is revealed. In this regard, the circuit components exhibiting low thermal outputs are mounted upon an input circuit board, while the circuit components exhibiting high heat dissipation or higher thermal output characteristics are mounted so as to be in a direct heat or thermal transfer relationship with the platform 12 and its thermally associated folded fin heat exchanger array 14. In FIG. 9, power converter 254 is seen in an orientation wherein its heat transfer surface at 330 is intimately connected in thermal transfer relationship with the interior surface 338 of platform 12. The figure also shows the integral forming of front end wall 20 and rear end wall 22 with platform 12. This permits a transfer of heat introduced into those walls 20 and 22 to the platform 12 and its associated heat exchanger array 14. To the opposite side of converter 254 as well as converters 252 and 253 there is attached a dc-to-dc circuit board 332 the surface of circuit board 332 to which converter 254 is attached is seen to be spaced apart in parallel adjacency with the internal surface 338 of platform 12. Note, additionally, that the same surface of circuit board 332 supports connector assembly 46. In this regard, looking additionally at FIG. 10, the connector assembly 46 is bolted to circuit board 332 at two outwardly extending ear locations 334 and 336. Returning momentarily to FIG. 5, this mounting of the connector 46 is seen to essentially center it at the top of rear end wall 22 such that it is readily aligned for insertion into the corresponding connector assembly at a back-plane.

FIG. 10 reveals that converter 254 is bolted to the interior surface 338 of platform 12 by four bolt and nut assemblies. The heads of these bolts are mounted within platform 12 and extend rigidly outwardly therefrom. In FIG. 10, the sections of the shanks of four such bolts are seen at 340–343.

Figure 11:
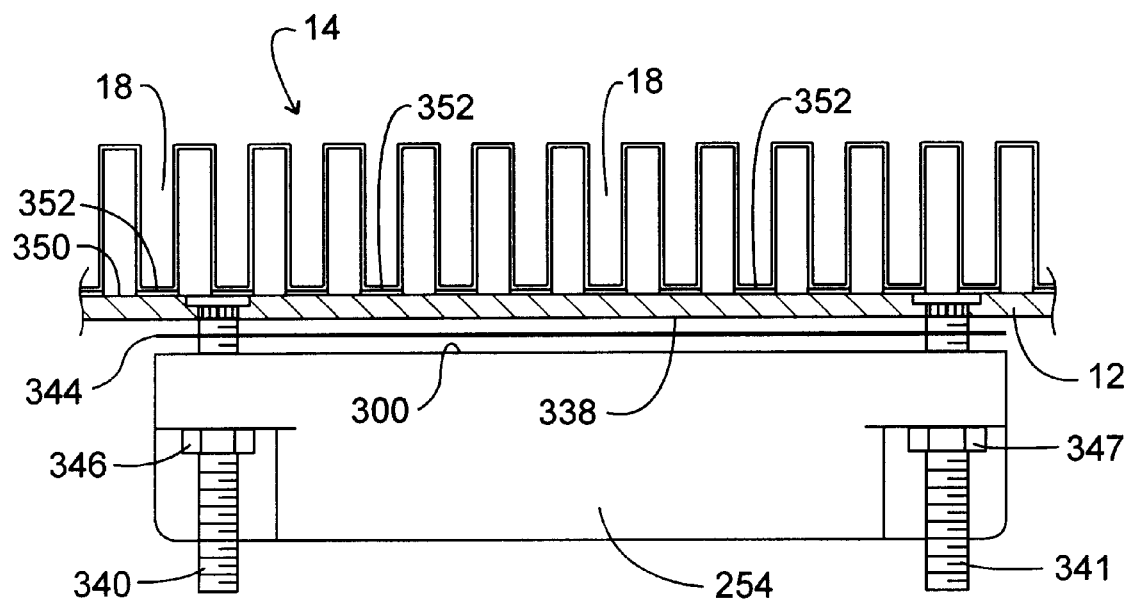
FIG. 11 is a partial view showing the attachment of a power converter to the platform of the power supply of FIG. 1.

FIG. 11 is an exaggerated and expanded view of the mounting of the power converters and, particularly, converter 254 with platform 12. To enhance thermal transfer from the heat transfer surface 300 of converter 254 to the interior surface 338 of platform 12, an aluminum foil pad 344 which is coated with a thernally conducted conformal material, such as thermally conductive silicone grease, is positioned intermediate surfaces 300 and 338. The thickness of the silicone grease carrying pad is about 0.003 inch. With the pad 344 in place, nuts as at 346 and 347 are tightened over respective bolts 340 and 341 to achieve an intimate thermal exchange bond between the surface 300 and platform 12.

Power converters 252 and 253 are coupled to the interior surface 338 of platform 12 in the same manner. Looking again at FIG. 10, it may be seen that sections of four connector bolts 354–357 are shown in connection with converter 253. Similarly, sections of connector bolts 359–362 are seen as the attachment for converter 252 to the interior surface 338. The surfaces opposite the heat transfer surfaces of converters 252 and 253 also are attached to the power circuit board 332 to provide support to it.

Figure 12:
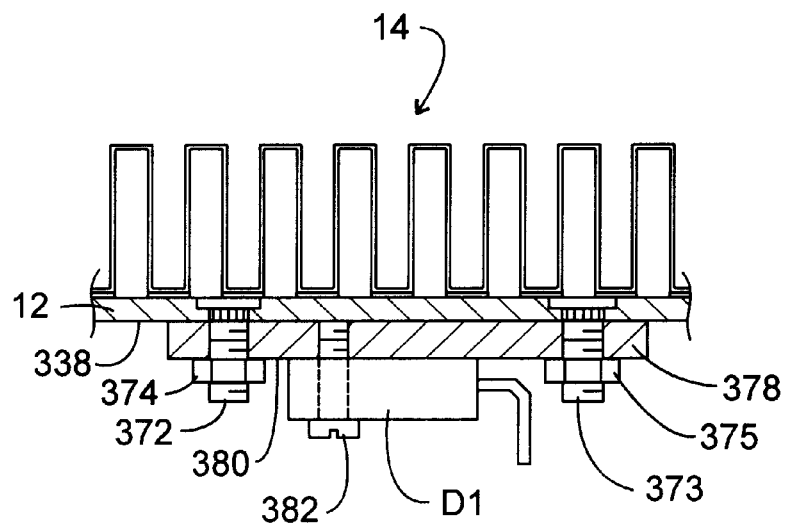
FIG. 12 is a partial sectional view showing the connection of a blocking diode to the platform of the power supply of FIG. 1.

FIG. 9 further reveals posts or standoffs as at 364 and 366 and an associated bolt assemblies which serve to space and support an input circuit aboard 368 from circuit board 332 and retain it in parallel relationship with the interior surface 338 of platform 12. Circuit board 368 serves, inter alia, to support circuit components which are characterized in having low thermal outputs or low thermal dissipation. One such component seen in FIG. 9 is a relatively larger inductor 370 additionally seen in FIG. 10. This inductor is the inductive component of the boost converter described in FIG. 7B in connection with block 130. Inasmuch as it is a low heat dissipater it is mounted upon input circuit board 368. Cooling for such components is provided by the air passage openings 26 in top wall 24 and openings 32 in bottom wall 30 (FIGS. 2 and 4). In contrast, blocking diodes D1, D2 and D3 are attached in thermal communication with the interior surface 338 of platform 12. FIG. 9 shows the mounting of blocking diode D3 at that surface. Looking additionally to FIG. 12, the mounting of these diodes is illustrated in connection with diode D1. In the figure, two bolts are rigidly mounted at their heads within platform 12 and extend outwardly and rigidly from platform 12 interior surface 338. Initially mounted upon bolts 372 and 373, using respective nuts 374 and 375, is a rectangular aluminum heat spreader 378. Heat spreader 378 is provided having a thickniess of about 0.125 inch and a surface area greater than the attaching surface area of blocking diode D1. Diode D1, in turn, is attached firmly to the surface 380 of heat spreader 378 utilizing a bolt 382.

Diode D3 seen additionally in FIG. 9 to be similarly attached to interior surface 338. In this regard, the diode is attached to a heat spreader 384 which is attached to platform 12 by bolts 386 and 387. A bolt 388 connects diode D3 to the heat spreader 384.

Diode D2 is connected to platform 12 in the same manner. As seen in FIG. 10, diode D2 is attached by bolt 390 to a rectangular heat spreader 392. Heat spreader 392, in turn is connected to platform 12 by bolt and nut assemblies 394 and 395. Other higher heat dissipating components include two diodes, two switching transistors and a freewheeling diode forming part of the noted boost converter described in conjunction with block 130. These two FET transistors are shown at 398 and 399 and the freewheeling diode is shown at 400 in FIG. 10. Transistor 399 additionally is seen in FIG. 9. Note that transistors 398 and 399 and diode 400 are intimately attached in thermal exchange relationship with the interior surface 402 of forward end wall 20 by respective bolt and nut assemblies 404–406. Thus, heat generated by devices 398–400 is conveyed through the front end wall 20 to the platform 12 for dissipation strongly influenced by the folded fin array 14.

Forward end wall 20 also dissipates heat from the bridge rectifier described at 126 in FIG. 7B. This rectifier is shown in FIG. 10 in intimate heat exchange attachment with surface 402 of front end wall 20. Also mounted at forward end wall 20 are the earlier described light emitting diodes 174 and 236 shown in FIG. 10 with the same numeration. Switch SW1 also is mounted at the front wall 20. These latter low heat dissipating components are coupled with input circuit board 368. It may be recalled from the discussion in connection with FIGS. 1 and 6 that devices 174, 236 and SWI reside behind respective apertures 100, 102 and 104.

Other relatively low heat dissipating components which are mounted upon circuit board 368 are inductors 408 and 409, as well as capacitors 410–415 representing the components of the EMI filter described in conjunction with block 114 in FIG. 7A The large hold-up and filtering capacitors described in FIG. 7B in conjunction with block 147 are seen in FIG. 10 at 418–420. These devices also are mounted upon input circuit board 368. Additionally mounted on that board is the step down transformer component of auxiliary power supply 150 as described in conjunction with FIG. 7B. This transformer is seen at 422. Also mounted upon circuit board 368 as seen in FIG. 10 is the logic component of the boost converter control circuit described at block 132 in FIG. 7B. This logic device is identified at 424.

The above low heat dissipation components which are, for the most part, mounted upon input circuit board 368, receive requisite cooling or heat transfer from them by the air flow passing through the earlier noted arrays of air passage opening 26 and 32 seen respectively in FIGS. 2 and 4.

Figure 14:
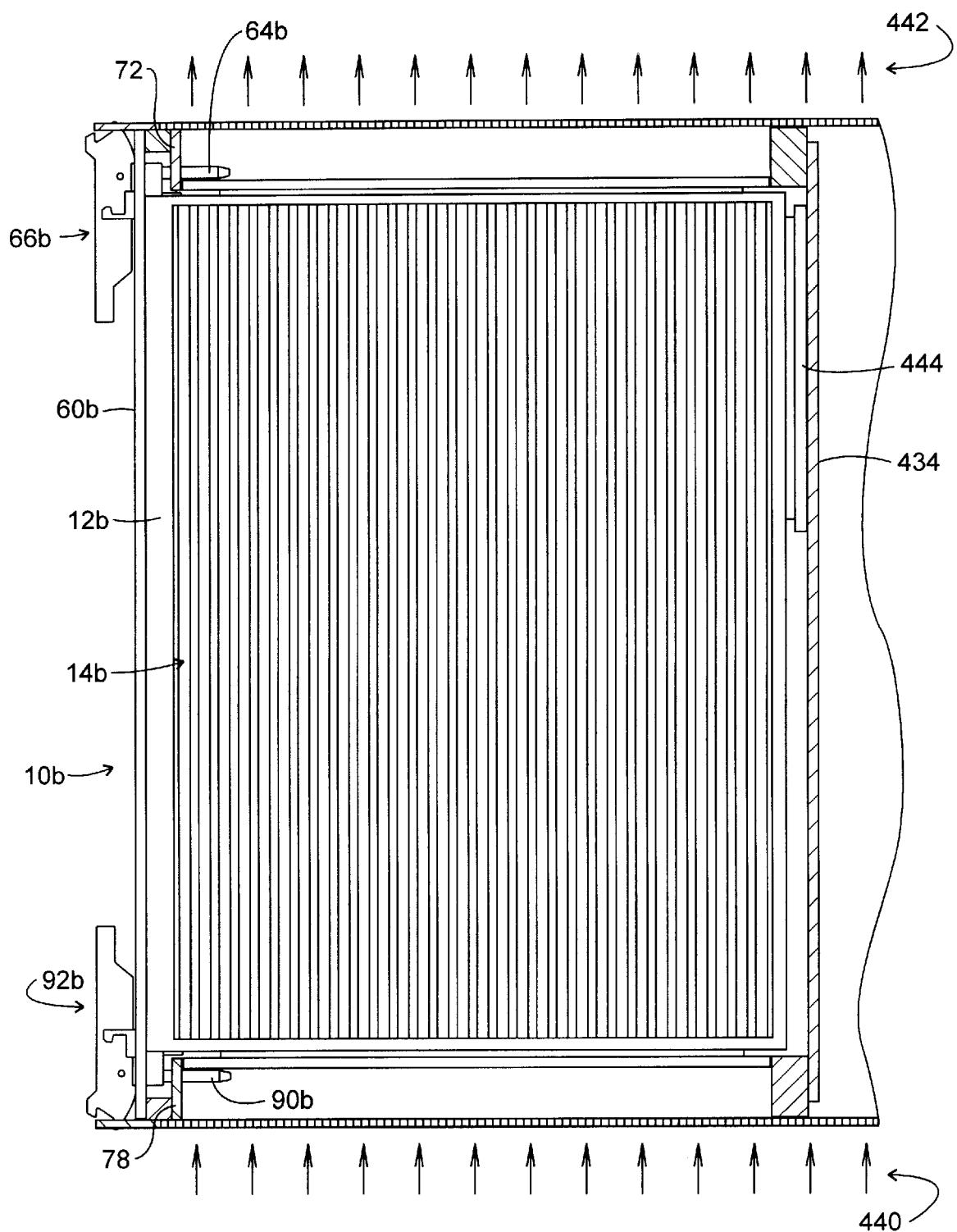
FIG. 14 is a sectional view taken through the plane 14—14 in FIG. 13.

Returning to FIG. 13, the card cage 74 is illustrated with no cards or circuit board positioned therein. Thus, the upper slots can be observed, for example, at 430 for each of the possible card positions. Similarly, certain of the lower slots are identified at 432. At a rearward portion of the card cage 74 there is a vertically oriented backplane shown at 434 from which extends an upper array of connectors shown generally at 436 and an aligned lower array of connectors represented generally at 438. The card cage 74 is configured such that a fan driven path of air moves through it from a lower region as represented at arrow array 440 to exit from the top of the cage as represented by arrow array 442. A pair of power supplies according to the invention are seen inserted within card cage 74 to provide a fault tolerant system wherein diodes D1–D3 function to protect against output shorts and the like in one or the other of the power supplies. The paired power supplies and their components as illustrated are given the same numerical identification given in the earlier figures but with a suffix "a" and "b". With the arrangement shown, air flow as represented by the arrow arrays 440 and 442 passes along and through the folded fin arrays of each power supply 10a and 10b and through the arrays of air path openings 32 (FIG. 4) and 26 (FIG. 2). FIG. 14 shows the array 14d for power supply 10b. That figure also reveals a pin connector 444 dedicated to power supplies as at 10 in connection with a corresponding connector, for example as described in connection with FIG. 5 at 46 (not shown).

Since certain changes may be made in the above-described apparatus without departing from the scope of the invention herein involved, it is intended that all matter contained in the description thereof or shown in the accompanying drawings shall be interpreted as illustrative and not in a limiting sense.

I claim:

1. In a system of electrical circuitry wherein circuit boards of predetermined height are vertically supported by oppositely disposed card support slots extending to a backplane, said backplane having a forward face with connectors including a power connector, said system having a path of fan driven air passing along said card slots, a power supply comprising:

a housing having a height corresponding with said predetermined height for slidable insertion within a said slot associated with said power connector, including a thermally conductive platform having oppositely disposed interior and exterior surfaces;

a thin sheet metal, folded fin heat exchanger array, mounted in thermal exchange relationship with said platform exterior surface, having spaced, heat exchange channels aligned for thermal exchange contact with said fan driven air when said housing is supported upon a said slot;

at least one power converter having a heat transfer surface coupled in thermal exchange relationship with said platform interior surface, having power input terminals for receiving a d.c. input and an output terminal assembly for providing a regulated d.c. output;

an input circuit for receiving a.c. power and deriving said d.c. input mounted within said housing; and a connector assembly in electrical communication with said input circuit and said output terminal assembly, mounted upon said housing at a rearward wall thereof for removable electrical connection with said power connector at said backplane when said housing is supported upon a said card slot aligned with said power connector.

2. The power supply of claim 1 in which said folded fin heat exchanger array channels are of generally U-shaped cross-sectional configuration.

3. The power supply of claim 1 in which said folded fin heat exchanger array is coupled to said platform with a thermally conductive adhesive layer having a thickness of less than about 0.001 inch.

4. The power supply of claim 1 in which said folded fin heat exchanger array is formed of sheet metal having a thickness of greater than about 0.020 inch and less than about 0.10 inch.

5. The power supply of claim 1 in which said folded fin heat exchanger array is formed of sheet metal having a thickness of about 0.012 inch.

6. The power supply of claim 1 in which said housing includes upper and lower elongate guides slideably insertable within said oppositely disposed slots.

7. The power supply of claim 1 including:

a power converter circuit board positioned over said power converter in parallel spaced relationship with said platform interior surface and in electrical communication with said power converter output terminal assembly, said input circuit and said connector assembly; and said housing including a metal cover positioned over said power converter circuit board and connected to said platform.

8. A power supply assembly for providing regulated D.C. power to a backplane at a forwardly facing connector assembly thereon aligned with a card support rack position of given height having oppositely disposed slots and located within a path of fan driven air flow, comprising:

a thermally conductive substantially flat platform having oppositely disposed interior and exterior surfaces and a height corresponding with said given height;

a thin sheet metal folded fin heat exchanger array mounted in thermal exchange relationship with said platform exterior surface, having alternating troughs and open channels normally vertically aligned for receiving said air flow in thermal exchange communication;

at least one power converter having a heat transfer surface coupled in thermal exchange relationship with said platform interior surface, having a d.c. input and an output terminal assembly for providing a regulated d.c. output;

an input circuit having electronic components for receiving a power input and deriving said d.c. input;

an input circuit board mounted in spaced apart parallel relationship with said platform and supporting low thermal output characterized ones of said input circuit electronic components; and a rearwardly facing connector assembly electrically coupled with said input circuit and said output terminal assembly and located for insertive electrical coupling with said forwardly facing connector assembly.

9. The power supply assembly of claim 8 including:

a top wall having a plurality of first air passage openings formed therein and extending normally from said platform;

an oppositely disposed bottom wall spaced from said top wall, having a plurality of second air passage openings formed therein and extending normally from said platform; and said first and second openings effecting conveyance of said fan driven air flow over said low thermal output characterized ones of said input circuit electronic components.

10. The power supply assembly of claim 9 in which said top wall and said bottom wall include respective upper and lower thin elongate guides slideably insertable within said oppositely disposed slots.

11. The power supply assembly of claim 8 in which said folded fin heat exchanger array channels are of generally U-shaped cross-sectional configuration.

12. The power supply assembly of claim 8 in which said folded fin heat exchanger array is coupled to said platform with a thermally conductive adhesive having a thickness of less than about 0.001 inch.

13. The power supply assembly of claim 8 including a blocking diode electrically coupled intermediate said power converter output terminal assembly and said connector assembly and connected in thermal exchange relationship with said platform interior surface.

14. The power supply assembly of claim 8 including a thermally conductive heat spreader having a first surface of greater area extent than the surface of said blocking diode, connected in intimate thermal exchange relationship with said platform interior surface, and having an oppositely disposed second surface coupled in intimate thermal exchange relationship with said surface of said blocking diode.

15. The power supply assembly of claim 8 in which;

said platform includes a thermally conductive end wall integrally formed therewith, extending normally thereto and having an interior surface; and said input circuit includes a rectifier bridge formed of rectifier diodes, said rectifier bridge being coupled in thermal exchange relationship with said end wall interior surface.

16. The power supply assembly of claim 8 in which said folded fin heat exchanger is formed from sheet metal having a thickness of less than about 0.020 inch and greater than about 0.010 inch.

17. The power supply assembly of claim 8 in which said folded fin heat exchanges is formed from sheet metal having a thickness of about 9.12 inch.

18. A power supply for a system of electrical circuitry wherein circuit boards of predetermined height are supported by oppositely disposed slots of a rack assembly extending to adjacency with a backplane, said backplane having a forewardly facing connector assembly thereon carrying an a.c. input and aligned with a power designated location in said rack assembly, said system having a path of fan driven air passing along said rack assembly, said power supply comprising;

a housing having a height corresponding with said predetermined height for slideable insertion within said slots at said power designated location, including a thermally conductive platform having oppositely disposed interior and exterior surfaces;

a thin sheet metal folded fin heat exchanger array mounted in heat exchange relationship with said platform exterior surface, having elongate parallel channels aligned for receiving said air flow in thermal exchange communication;

at least one power converter having a heat transfer surface coupled in thermal exchange relationship with said platform interior surface, having a d.c. high voltage input and an output terminal assembly for providing a regulated d.c. output;

a power supply connector assembly connectable with said forwardly facing connector assembly at said backplane for receiving said a.c. input and providing said regulated d.c. output to said backplane;

an input circuit within said housing coupled with said power supply connector assembly for receiving said a.c. input and including an electromagnetic interference filter stage, a surge limiter, an inrush current limiter, a bridge rectifier providing an initial d.c. voltage and current output, a boost converter responsive to said initial d.c. voltage and current and to a boost control input to carry out power factor correction to provide a booster high voltage d.c. output, and a boost converter control circuit responsive to electrical parameter inputs to derive said boost control input; and a d.c.-to-d.c. circuit coupled with said power converter d.c. high voltage input for supplying said booster high voltage d.c. output thereto and coupled intermediate said converter output terminal assembly and said power supply connector assembly for conveying said regulated d.c. output to said backplane.

19. The power supply of claim 18 in which said folded fin heat exchange array channels are of generally U-shaped cross-sectional configuration.

20. The power supply of claim 18 in which said folded fin heat exchanger is formed from sheet metal having a thickness of less than about 0.020 inch and greater than about 0.010 inch.

21. The power supply of claim 20 in which said folded fin heat exchanger array is coupled to said platform with a thermally conductive adhesive layer having a thickness of less than about 0.001 inch.

22. The power supply of claim 20 in which:

said housing includes a thermally conductive end wall formed integrally with and disposed normally to said thermally conductive platform and having an interior surface; and said bridge rectifier being coupled in thermal exchange relationship with said end wall interior surface.

23. The power supply of claim 22 in which:

said boost converter includes at least one switching transistor; and said switching transistor is coupled in thermal exchange relationship with said end wall interior surface.

24. The power supply of claim 18 in which said folded fin heat exchanges array is formed of sheet metal having a thickness of about 0.012 inch.

25. The power supply of claim 18 in which said housing includes a top wall having a plurality of air passage openings formed therein, and an oppositely disposed bottom wall having a plurality of air passage openings therein, each said top wall and bottom wall being disposed normally to said platform, said openings admitting and promoting the conveyance of said fan driven air through the interior of said housing.

26. The power supply of claim 18 in which:

said d.c.-to-d.c. circuit includes a blocking diode electrically coupled intermediate said power converter output terminal assembly and said connector assembly and having a surface of given heat dissipating surface area; and including a thermally conductive heat spreader having a first surface of greater area extent than said given heat dissipating surface area connected in intimate thermal exchange relationship with said platform interior surface and an oppositely disposed second surface coupled in intimate thermal exchange relationship with said blocking diode surface.

27. The power supply of claim 18 including:

a power converter circuit board supporting components of said d.c.-to-d.c. circuit having a first surface positioned over a surface of said power converter opposite said heat transfer surface in spaced parallel relationship with said platform interior surface; and said power supply connector assembly is mounted upon said power converter circuit board first surface.

28. In a system of electrical circuitry wherein circuit boards of predetermined height are vertically supported by oppositely disposed card support slots extending to a backplane, said backplane having a forward face with connectors including a power connector, said system having a path of fan driven air passing along said card slots, a power supply comprising:

a housing having a height corresponding with said predetermined height for slidable insertion within a said slot associated with said power connector, including a thermally conductive platform having oppositely disposed interior and exterior surfaces;

a thin sheet metal, folded fin heat exchanger array, mounted in thermal exchange relationship with said platform exterior surface, having spaced, heat exchange channels aligned for thermal exchange contact with said fan driven air when said housing is supported upon a said slot;

at least one power converter having a heat transfer surface coupled in thermal exchange relationship with said platform interior surface, having power input terminals for receiving a d.c. input and an output terminal assembly for providing a regulated d.c. output;

an input circuit for receiving a.c. power and deriving said d.c. input mounted within said housing;

a connector assembly in electrical communication with said input circuit and said output terminal assembly, mounted upon said housing at a rearward wall thereof for removable electrical connection with said power connector at said backplane when said housing is supported upon a said card slot aligned with said power connector; and a blocking diode electrically coupled intermediate said power converter output terminal assembly and said connector assembly and coupled in thermal exchange relationship with said platform interior surface.

29. In a system of electrical circuitry wherein circuit boards of predetermined height are vertically supported by oppositely disposed card support slots extending to a backplane, said backplane having a forward face with connectors including a power connector, said system having a path of fan driven air passing along said card slots, a power supply comprising:

a housing having a height corresponding with said predetermined height for slidable insertion within a said slot associated with said power connector, including a thermally conductive platform having oppositely disposed interior and exterior surfaces and a thermally conductive end wall formed integrally with and disposed normally to said thermally conductive platform and having an interior surface;

a thin sheet metal, folded fin heat exchanger array, mounted in thermal exchange relationship with said platform exterior surface, having spaced, heat exchange channels aligned for thermal exchange contact with said fan driven air when said housing is supported upon a said slot;

at least one power converter having a heat transfer surface coupled in thermal exchange relationship with said platform interior surface, having power input terminals for receiving a d.c. input and an output terminal assembly for providing a regulated d.c. output;

an input circuit for receiving a.c. power and deriving said d.c. input mounted within said housing and including a bridge rectifier formed of rectifier diodes, said bridge rectifier being coupled in thermal exchange relationship with said end wall interior surface; and a connector assembly in electrical communication with said input circuit and said output terminal assembly, mounted upon said housing at a rearward wall thereof for removable electrical connection with said power connector at said backplane when said housing is supported upon a said card slot aligned with said power connector.

30. In a system of electrical circuitry wherein circuit boards of predetermined height are vertically supported by oppositely disposed card support slots extending to a backplane, said backplane having a forward face with connectors including a power connector, said system having a path of fan driven air passing along said card slots, a power supply comprising:

a housing having a height corresponding with said predetermined height for slidable insertion within a said slot associated with said power connector, including a thermally conductive platform having oppositely disposed interior and exterior surfaces, said housing including a top wall having a plurality of air passage openings formed therein, and an oppositely disposed bottom wall having a plurality of air passage openings therein, each said top wall and bottom wall being disposed normally to said platform, said openings promoting the conveyance of said fan driven air through said housing;

a thin sheet metal, folded fin heat exchanger array, mounted in thermal exchange relationship with said platform exterior surface, having spaced, heat exchange channels aligned for thermal exchange contact with said fan driven air when said housing is supported upon a said slot;

at least one power converter having a heat transfer surface coupled in thermal exchange relationship with said platform interior surface, having power input terminals for receiving a d.c. input and an output terminal assembly for providing a regulated d.c. output;

an input circuit for receiving a.c. power and deriving said d.c. input mounted within said housing, including a planar circuit board supporting electrical components thereof mounted within said housing in parallel spaced apart relationship with said platform interior surface; and a connector assembly in electrical communication with said input circuit and said output terminal assembly, mounted upon said housing at a rearward wall thereof for removable electrical connection with said power connector at said backplane when said housing is supported upon a said card slot aligned with said power connector.

31. The power supply of claim 30 including a power converter circuit board positioned over said power converter in spaced apart, parallel relationship with said platform interior surface and in electrical communication with said power converter power input terminals, said output terminal assembly, said input circuit and said connector assembly.

32. The power supply of claim 31 in which said connector assembly is mounted upon said power converter circuit board.

* * * * *